United States Patent [19]

Choi

[11] Patent Number: 5,225,814

[45] Date of Patent: Jul. 6, 1993

[54] DEVICE FOR DETECTING DEFECTIVE CORE WIRES OF A MULTI-CORE CABLE

[76] Inventor: Chang-Joon Choi, 895-8 Dogok-dong, Kangnam-gu, Seoul 135-270, Rep. of Korea

[21] Appl. No.: 775,610

[22] Filed: Oct. 15, 1991

[30] Foreign Application Priority Data

Oct. 16, 1990 [KR] Rep. of Korea ............... 16491/1990

[51] Int. Cl.⁵ ............................................ G08B 21/00
[52] U.S. Cl. .................................... 340/635; 324/539
[58] Field of Search ........................ 340/635, 650, 651; 324/539, 540, 541, 542, 66; 73/158; 379/26

[56] References Cited

U.S. PATENT DOCUMENTS 4,158,167 6/1979 Tanno et al. ...................... 324/539
4,928,066 5/1990 Adlon et al. ...................... 324/539

Primary Examiner—Jin F. Ng
Assistant Examiner—Jeffery A. Hofsass
Attorney, Agent, or Firm—Finnegan, Henderson, Farabow, Garrett & Dunner

[57] ABSTRACT

The device of this invention includes a first revolving board having several indents in its circumference, a second revolving board having indents corresponding to those in the first revolving board, a photo sensor operated by the indents of the second revolving board, and a control circuit. The control circuit, upon receipt of output of the photo sensor, is operated to pause the stepping motor, turn it in the reverse direction up to a certain angle, and then again turn it in the original direction, so as to make a single core wire of a cable inserted precisely in an indent of the first revolving board.

3 Claims, 6 Drawing Sheets

DEVICE FOR DETECTING DEFECTIVE CORE WIRES OF A MULTI-CORE CABLE

BACKGROUND OF THE INVENTION

The present invention relates to a novel device for detecting defective core wires of a multi-core cable, and more particularly to a device for detecting broken ones while picking up and conveying core wires of a multi-core cable one by one with precision in its manufacturing process.

In general, a multi-core cable includes from scores to thousands of core wires insulated from each other. The core wires are wrapped in one with a common covering material. It is necessary, therefore, in a manufacturing process of the cable, to make sure that a defective core wire is not included, by checking whether each core wire is defective, to exclude defective ones.

To make sure that each core wire in a multi-core cable is not defective, a method has been adopted of attaching both ends of each core wire, by turns, to terminals of a tester and measuring resistance of the core wires to determine whether or not the particular one is defective or whole. This method, however, requires too much time, which is a disadvantage.

Another method has been to place core wires tightly on a revolving board with indents in its circumference so that each core wire will enter one of the indents, and then to check whether it is defective, while conveying all the core wires one after another. This method is easy and fast in checking whether or not a core wire is defective. However, according to the method, at times more than one core wire is able to enter an indent while measuring, hence making it impossible to determine exactly which particular core wire is defective.

Therefore, an object of the present invention is to provide a device for detecting fast, readily and precisely, any breach of core wires of a multi-core cable in a manufacturing process of the cable.

SUMMARY OF THE INVENTION

With a view to the attainment of the aforesaid object, the device for detecting defective core wires of a multi-core cable of the present invention comprises a first revolving board having a plurality of indents set apart at a certain angle and cut in its circumference for catching each core wire for conveyance and inspection, a second revolving board having, in its circumference, indents corresponding to those in the first revolving board, a pressing device positioned over the first revolving board for securing of core wires of the multiple-core cable on the circumference of the first revolving board, a stepping motor for turning the first and second revolving boards, and a photo sensor fitted near the second revolving board, whereby the photo sensor is operated by the indents of the second revolving board as the second revolving board revolves, a guiding member positioned near the circumference of the first revolving board, a control circuit which controls the stepping motor in a manner that, upon receipt of the output of the photo sensor, the control circuit pauses the revolution of the stepping motor, turns it in the reverse direction up to a certain angle, and then again turns it in its forward, original direction so as to allow a single core wire of the multi-core cable to be inserted in an indent in the circumference of the first revolving board.

According to the device for detecting defective core wires of a multi-core cable, first, each core wire of a multi-core cable is placed tightly on the circumference of the first revolving board by the pressing device. Then the stepping motor comes in motion, whereby the first and second revolving boards revolve both on the same rotation axis of the stepping motor, and the photo sensor device comes into operation when an indent of the second revolving board passes through the photo sensor. The output of the photo sensor is sent to the control circuit. Then the contol circuit works to pause the stepping motor and after controlling it to turn in the reverse direction up to a certain angle, to turn it again in the original direction, whereby one of the core wires pressed tightly on the circumference of the first revolving board gets caught in an indent. Then the core wire inserted in the indent and conveyed is stripped of its cover by a blade, and a broken wire detecting terminal is placed into contact with the conducting material of the core wire so that the core wire is checked for defectiveness by the control circuit and the number of defective core wires is displayed on a display board.

The novel features which are considered as characteristic of the invention are set forth in particular in the appended claims. The invention itself, however, as to its construction together with its additional objects and advantages thereof, will be best understood from the aspects and following description of specific embodiment, when read in connection with the accompanying drawings.

DETAILED DESCRIPTION OF PREFERRED EMBODIMENTS

Figure 1:
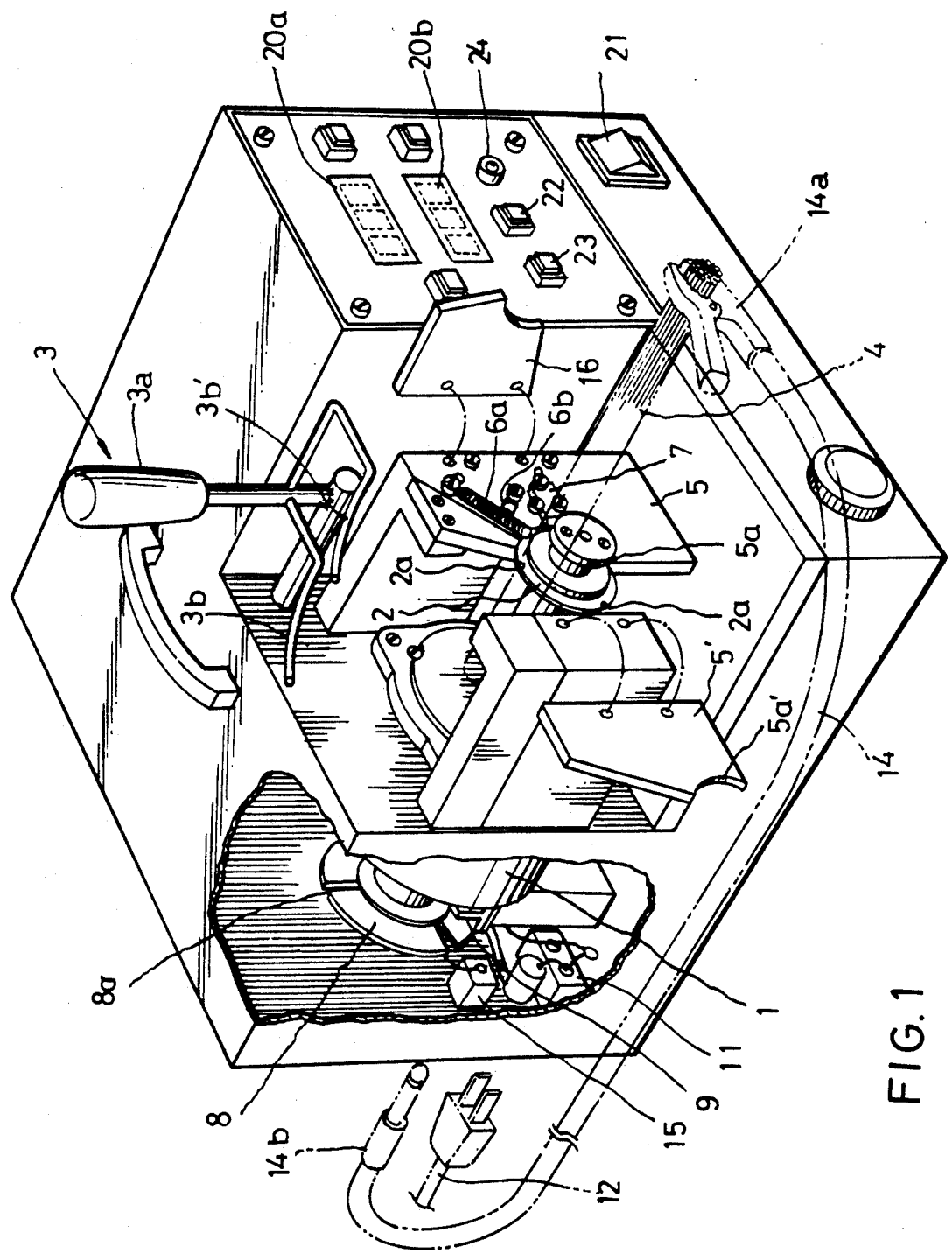
FIG. 1 is a partial cutaway perspective view of the device for detecting a defective core wire of a 'multi-core cable of the present invention.
Figure 2:
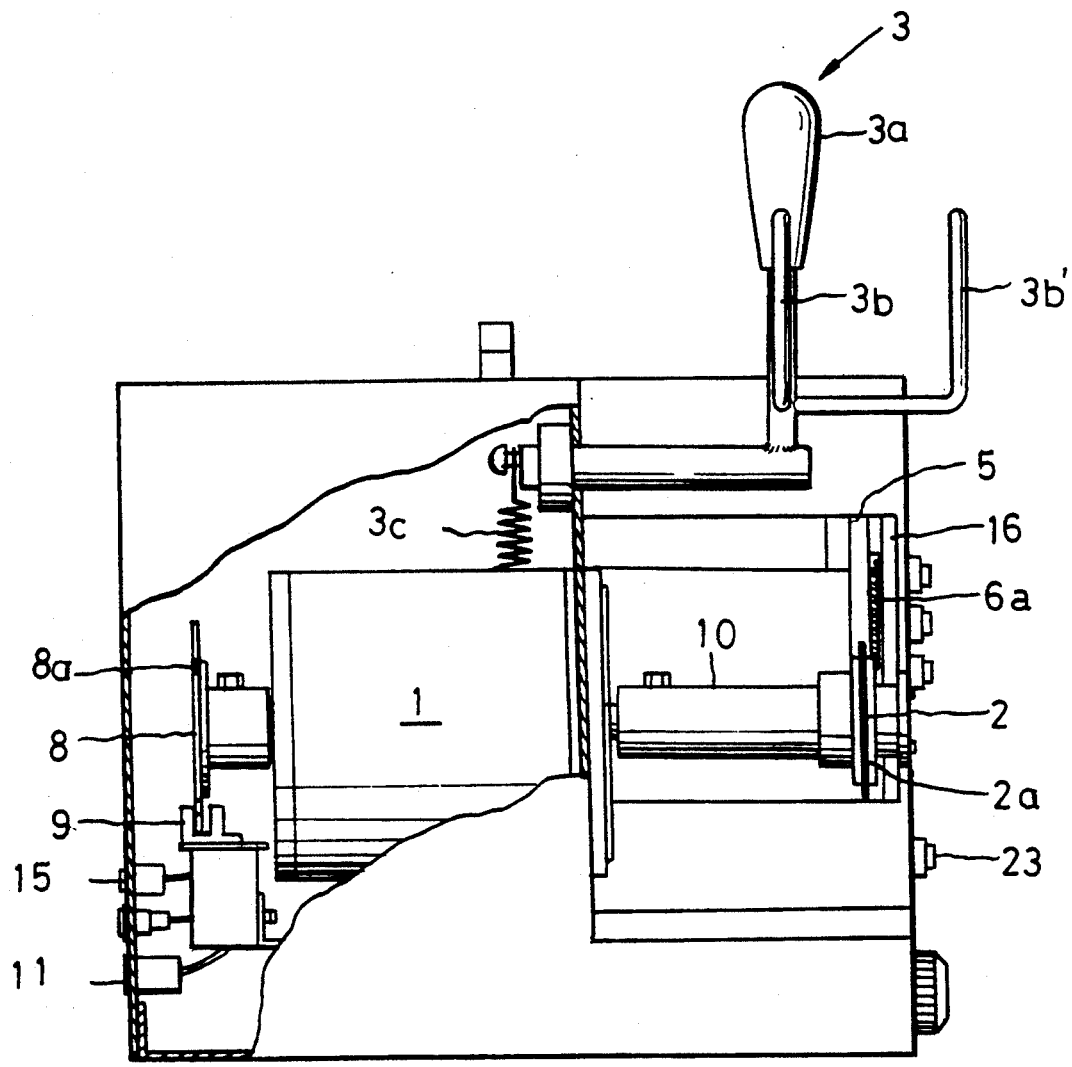
FIG. 2 is a partial cutaway side view of the device of the present invention.
Figure 3A:
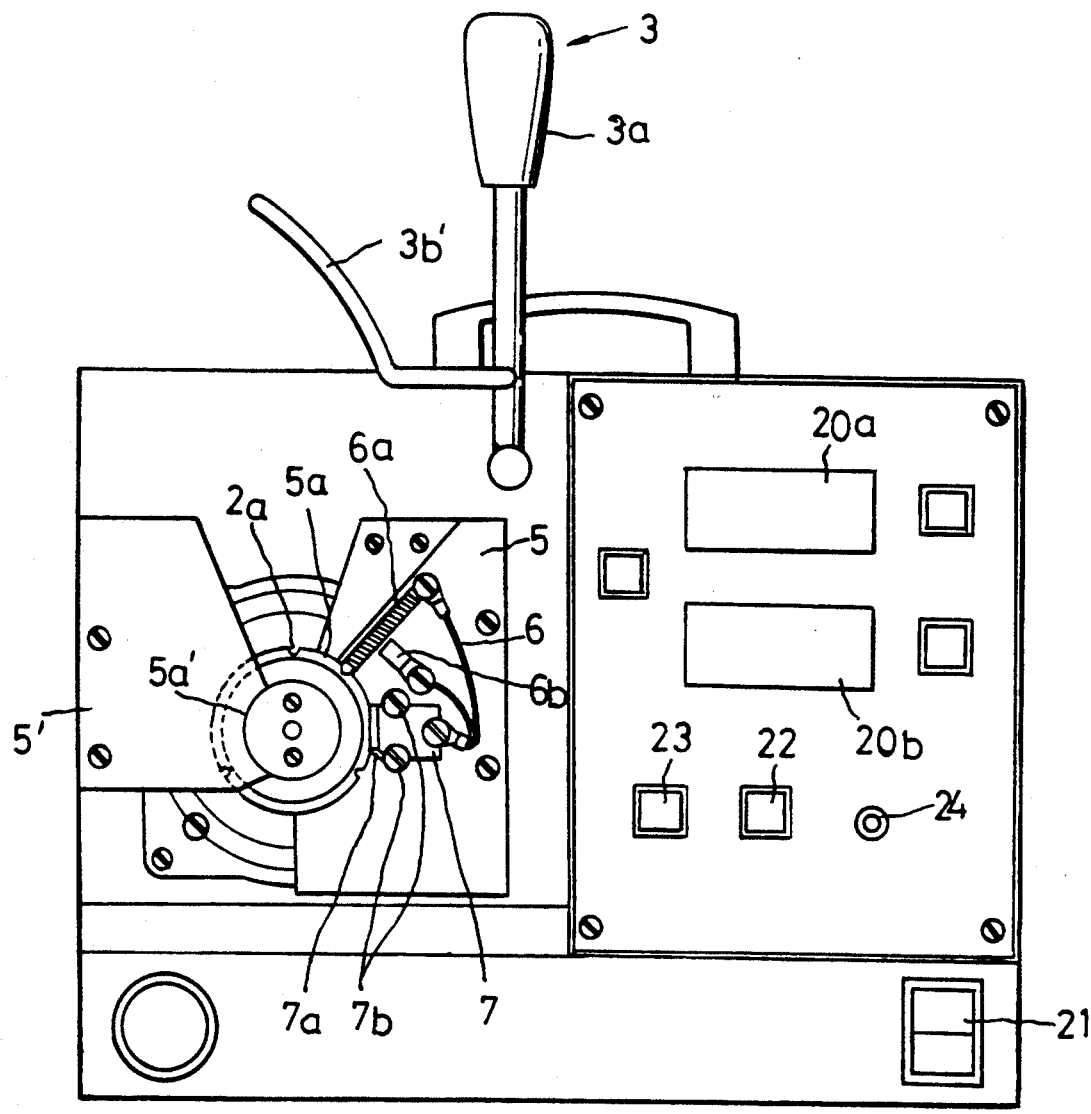
FIGS. 3A and 3B are operational and elevational views of the device.
Figure 3B:
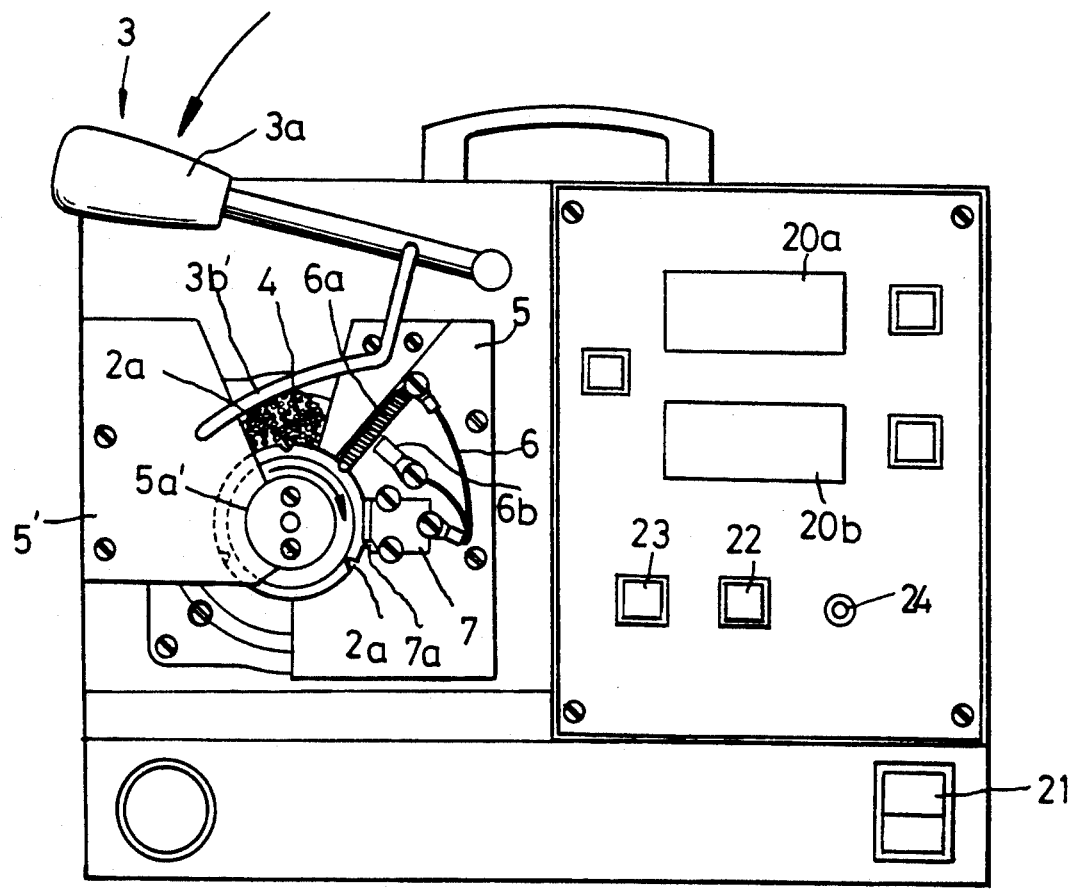
Figure 4:
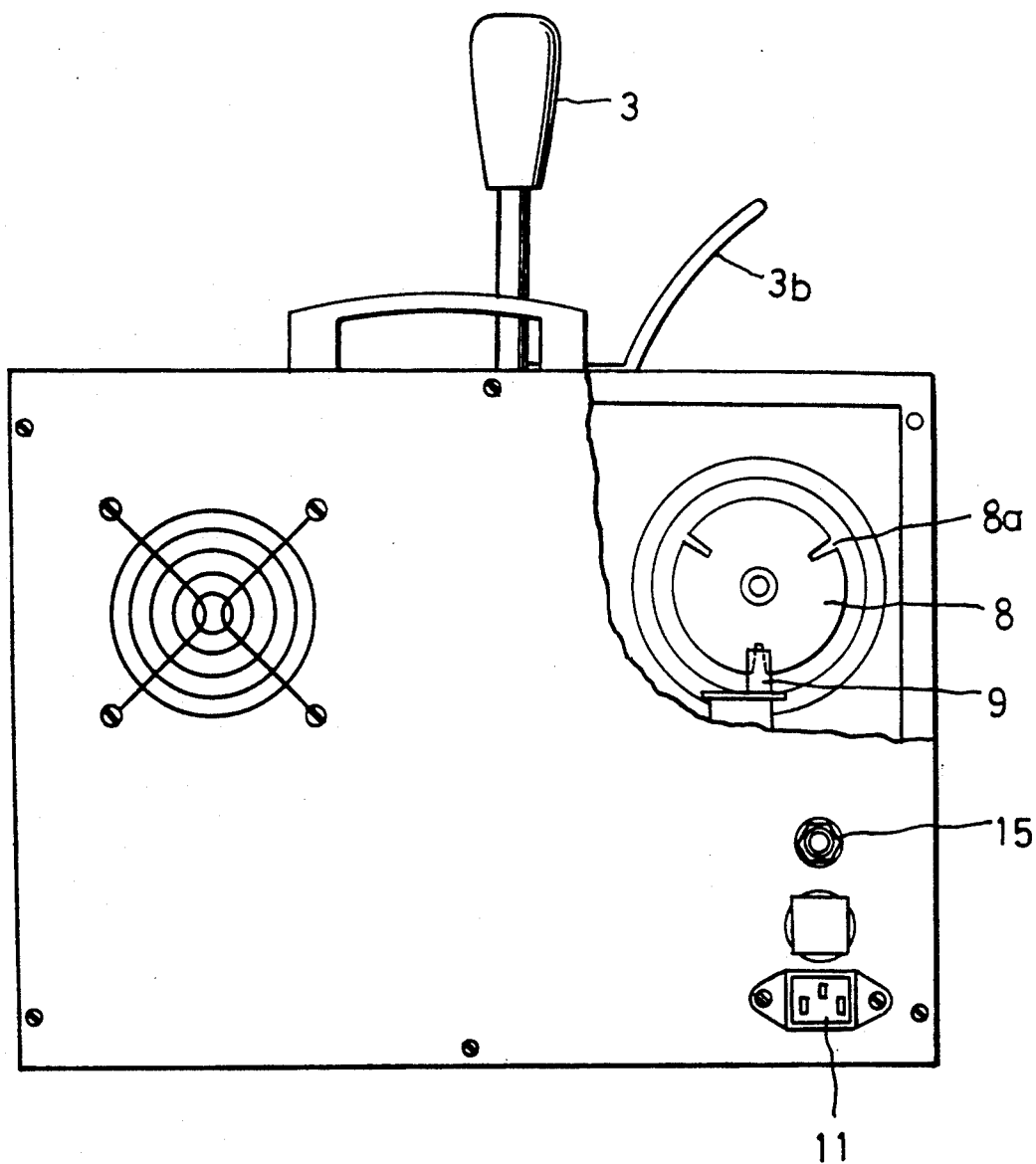
FIG. 4 is a partial cutaway rear view of the device.

Below, the preferred embodiment of the present invention is described with reference to the attached drawings.

As is shown in FIGS. 1 to 4, a device for detecting defective core wires of a multi-core cable of the present invention has a first revolving board 2 with indents 2a set apart at a certain angle and cut in its circumference, and a second revolving board 8 with indents 8a corresponding to the indents 2a of the first revolving board 2. Both of these revolving board 2 and 8 are fixed on the ends of the rotation axis 10 of the stepping motor 1, respectively.

Near the circumference of the second revolving board 8 is a photo sensor 9 fitted so that the light emitted by the light emitting element of the photo sensor 9 will pass through the indents 8a to be received back by the receiver section of the photo sensor 9.

On the upper side of the first revolving board 2 a pressing device 3 is fitted which is intended to press the core wires down on the circumference of the first revolving board 2. The pressing device 3 has a handle 3a and two arms 3b and 3b', and is fixed via a spring 3c. Respectively near the left and right sides, each of the first revolving board 2 guiding members 5 and 5' are fitted. In these guiding members 5 and 5' curved surfaces 5a and 5a' with a diameter nearly the same as that of the first revolving board are formed, and in which curved surfaces 5a and 5a' the first revolving board 2 is inserted and rotated.

Only the core wire that enters an indent 2a in the circumference of the first revolving board 2 is conveyed, while the others which do not enter the indents hit against the curved surface 5a to be stopped from being conveyed.

To the guiding member 5, a core wire counter terminal 6 having a movable terminal 6a and a fixed terminal 6b is fitted for counting the number of conveyed core wire. The movable terminal 6a is made of an elastic material and its one end is fixed while the other free and is extended to reach the circumference of the first revolving board 2 so that a core wire conveyed may push the free end of the elastic material to get it into contact with the fixed terminal 6b. The core wire counter terminal 6 is connected to a display circuit 102 of a control circuit 20 to show the number of core wires conveyed.

To the guiding member 5, a defective core wire detecting terminal 7 intended for detection of defective core wires is attached. The defective wire detecting terminal 7 has a blade 7a for cutting and stripping covers of a core wire conveyed, and it also has an adjusting section 7b for adjusting the gap between the blade 7a and the first revolving board 2 according to the thickness of the core wires and the thickness of the cover of core wires.

Figure 5:
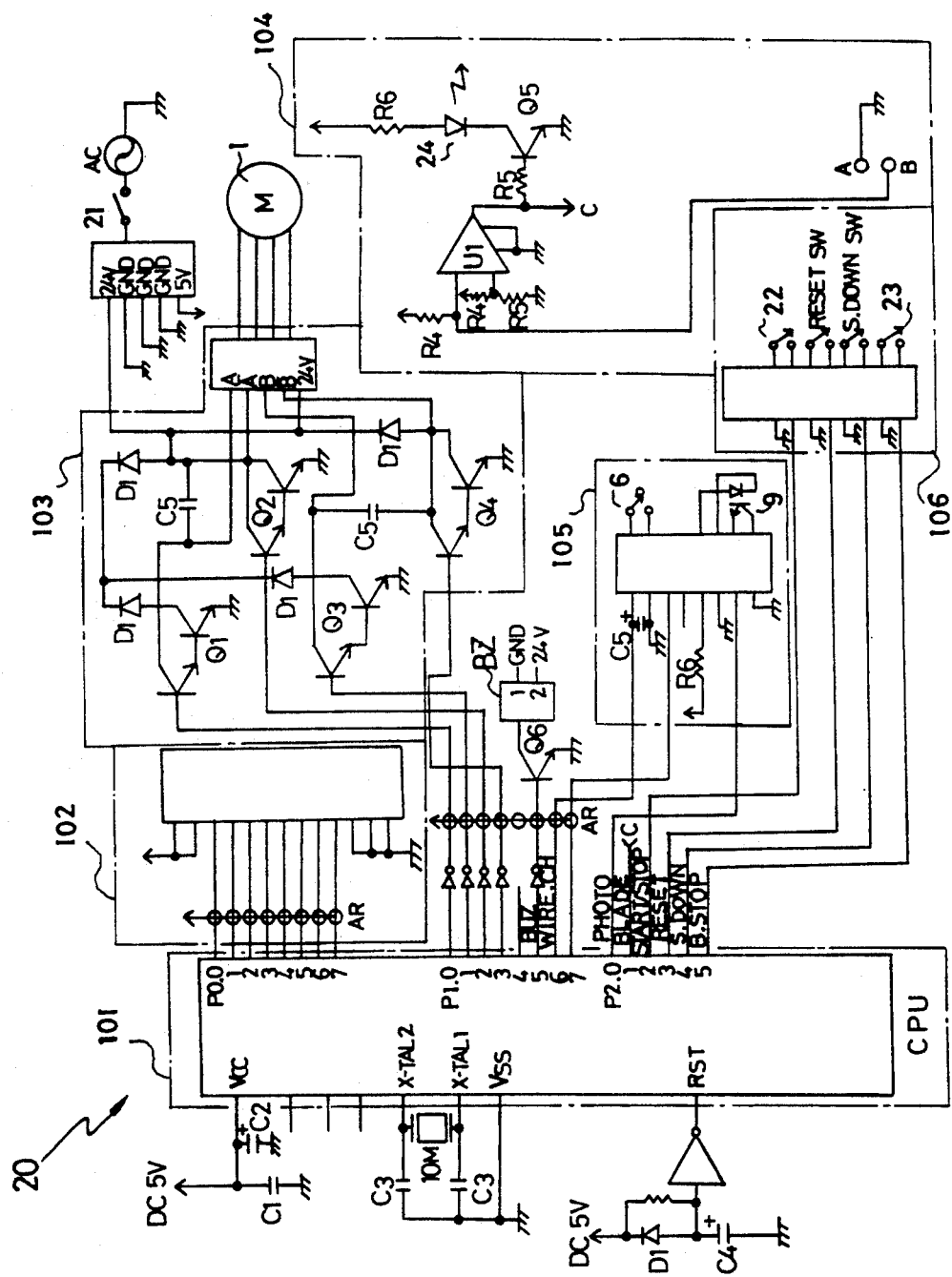
FIG. 5 is a circuit diagram of a control device of the device of the present invention.

To the stepping motor 1 is connected a control circuit 20. This control circuit 20 has, as is shown in FIG. 5, CPU 101, display circuit 102, stepping motor driver 103, a defective core wire detect 104. To the CPU 101, in turn, are connected a terminal 105 for connection of the photo sensor 9 and the core wire counter terminal 6, and a switching connection terminal 106 for connection of various switches. Further in FIGS. 1 to 4, 11 shows a power source jack, 12 a power cord, 13 a connection cord, 14a nippers, 14b a plug, 15 a jack, 16 a protection member, and 21, 22, and 23 a power switch, a start/stop switch, and a buzzer stop switch in that order.

Now a description of the operation of the device of the present invention is given in further detail below.

First, the core wires are stripped of the insulate cover at one end, made common, and trapped as one by the nippers 14a. Then the plug 14b connected to the nipper 14a by a connection cord 13 is inserted in the jack 15. The core wires, on the other end, and pressed down tightly on the circumference of the first revolving board 2 by the pressing device 3.

Then the power switch 21 and the start/stop switch 22 are pressed, and CPU 101 transmits, in a certain order, signals to transistors Q1 to Q4 of the stepping motor driving circuit 103 until a signal is output from the photo sensor 9 in accordance with the program stored inside, whereby the stepping motor 1 rotates in the forward direction (clockwise).

Then both the first and second revolving boards 2 and 8 also revolve. Now, the indents 8a in the circumference of the second revolving board 8 come to the photo sensor 9 to activate it, and a low level signal is input to the P2.0 port of CPU 101. (See FIG. 5)

Then CPU 101, in accordance with its program stored inside, transmits signals to the stepping motor driving circuit 103 through the P1.0 or P1.7 port of CPU 101 to pause the stepping motor 1 to turn it in the reverse direction (counter-clockwise) to a certain angle (to a certain step) only, to revert to the original direction.

As the core wires are kept pressed down tight on the circumference of the first revolving board 2 by the pressing device 3 for all this time, they accompany the revolution of the first revolving board 2 in its forward and reverse directions, and as a consequence, are easily inserted in the indents 2a in the circumference of the first revolving board 2.

Since the length and width of each of the indents 2a are arranged practically to match the diameter of a core wire, no indent 2a is capable of holding more than one wire at a time.

While the stepping motor 1 continues rotating in the forward direction after rotating in the reverse direction awhile, even if the indents 8a of the second revolving board 8 pass the photo sensor 9 to activate it, the CPU 101 in accordance with its stored program keeps transmitting signals to the stepping motor driving circuit 103 to make the stepping motor 1 rotate in the forward direction.

The first revolving board 2 keeps revolving in the forward direction when one core wire is entrapped in one of its indents 2a, and when the indent 2a pass the curved surface 5a of the guiding member 5, the core wire inserted in the indent alone can pass through. All the others being caught in the curved surface 5a of the guiding member 5, are unable to pass.

The core wire which is inserted in the indent 2a and passes through catches up with the movable terminal 6a of the core wire counter terminal 6, and shoving the movable terminal 6a on one side come in contact with its fixed terminal 6b.

In this way, as is illustrated in FIG. 5, a low level signal is transmitted to the P1.6 port of CPU 101, which in turn processes the signal and displays on the display board 20a the number of core wires detected through the counter circuit 102. Then, as core wire arrives at the defective core wire detecting terminal 7, the blade 7a peels off its cover to get into contact with the conducting material of the wire.

At Point A, shown in FIG. 5, ends of core wires made common are connected by the nipper 14a, the connection cord 13, the plug 14b and the jack 15 (See FIG. 1), while at Point B, the other ends of core wires are connected by the blade 7a of the defective core wire detecting terminal 7.

Accordingly, in case a core wire conveyed is not defective, Points A and B will come into contact when the conducting material of the core wire contacts with the blade 7a, a low level signal is input to the inverting input of the comparator U1 of the defective core wire detecting circuit 104, and as a result, the output signal of the comparator U1 becomes high level, whereby the transistor Q5 is turned on, lighting the checking lamp 24.

The output signal of the comparator U1 is input to the P2.1 port of CPU 101 and CPU 101 processes the signal in accordance with the program and sends signals to the stepping motor driving circuit 103 through P1.0 to P1.3 ports to drive the stepping motor 1 in the forward direction.

However, in case a core wire conveyed is defective, the aforesaid Points A and B do not come into connection even if the blade 7a comes into contact with the conducting material of the core wire, and no new signal is transmitted to the input of the comparator U1 of the defective core wire detecting circuit 104.

If there is no change of signals in the input of the comparator U1 after the number of core wires is checked by the defective core wire detecting terminal 7, CPU 101 transmits signals in accordance with its stored program to P1.4 port so that the transistor Q6 is driven and buzzer BZ activated, while stopping transmission of signals to P1.0 to P1.3 ports so that the stepping motor 1 will come to a halt.

CPU 101 also transmits signals to a counter circuit 104 via P0.0 to P0.7 ports so that the display board 20b can show the number of defective core wires.

When the buzzer buzzes (activated), the user stops the alarm by pressing the buzzer stop button 23 and indicates the defective wire, then goes on with the broken wire detecting process by pushing the start/stop button 22. As the device will be readily understood by those skilled in the art by the illustration of the above-described embodiment, therefore, detailed description thereon will not be provided herein.

Although the present invention has been described and illustrated in detail, it is clearly understood that the same is by way of illustration and example only and is not to be taken by way of limitation, the spirit and scope of the present invention being limited only by the terms of the appended claim.

What is claimed is:

1. A device for detecting defective core wires of a multi-core cable comprising:

a first revolving board having a first plurality of indents set apart at a certain angle and cut in its circumference for catching each core wire for conveyance and inspection;

a second revolving board having, in its circumference, a second plurality of indents corresponding to the first plurality of indents in the first revolving board;

a pressing device positioned over the first revolving board for securing core wires of a multi-core cable on the circumference of the first revolving board;

a stepping motor for turning the first and second revolving boards in a first direction;

a photosensor fitted near the second revolving board, the photosensor operating in response to light passing through the indents of the second revolving board as the second revolving board revolves;

a guiding member positioned near the circumference of the first revolving board; and a control circuit for controlling the stepping motor, said control circuit, in response to an output of the photosensor, pauses the revolution of the stepping motor, turns the stepping motor in a second direction up to a certain angle, and then again turns the stepping motor in the first direction so as to allow a single core wire of the multi-core cable to be inserted in an indent in the circumference of the first revolving board.

2. The device for detecting defective core wires of a multi-core cable according to claim 1, further comprising a display device for displaying the number of core wires and defective core wires, respectively.

3. The device for detecting defective core wires of a multi-core cable according to claim 1, wherein said first direction is a forward direction and said second direction is a reverse direction.

* * * * *